United States Patent
Jones et al.

(10) Patent No.: US 7,622,313 B2
(45) Date of Patent: Nov. 24, 2009

(54) FABRICATION OF THREE DIMENSIONAL INTEGRATED CIRCUIT EMPLOYING MULTIPLE DIE PANELS

(75) Inventors: Robert E. Jones, Austin, TX (US); Scott K. Pozder, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 633 days.

(21) Appl. No.: 11/193,926

(22) Filed: Jul. 29, 2005

(65) Prior Publication Data

US 2007/0023121 A1 Feb. 1, 2007

(51) Int. Cl.
*H01L 21/00* (2006.01)
*B29C 65/00* (2006.01)

(52) U.S. Cl. ............... 438/22; 438/106; 438/108; 156/60

(58) Field of Classification Search ............... 438/22, 438/106, 108; 156/60
See application file for complete search history.

(56) References Cited

U.S. PATENT DOCUMENTS

| | | | |
|---|---|---|---|
| 4,939,568 A | 7/1990 | Kato et al. | |
| 4,954,875 A | 9/1990 | Clements | |
| 5,426,072 A | 6/1995 | Finnila | |
| 5,563,084 A | 10/1996 | Ramm et al. | |
| 6,226,394 B1 * | 5/2001 | Wilson et al. | 382/145 |
| 6,344,401 B1 * | 2/2002 | Lam | 438/460 |
| 6,664,132 B1 | 12/2003 | Buchner et al. | |
| 2003/0096454 A1 | 5/2003 | Poo et al. | |
| 2004/0021479 A1 | 2/2004 | Lin et al. | |
| 2004/0051547 A1 | 3/2004 | Ma et al. | |

OTHER PUBLICATIONS

Hayashi et al., Fabrication of Three-Dimensional IC Using "Cumulatively Bonded IC" (CUBIC) Technology, Symposium on VLSI Technology, 1990, p. 95.
Hayashi et al., A New Three Dimensional IC Fabrication Technology, Stacking Thin Film Dual-CMOS Layers, IEDM, 1991, p. 657.
Reif, et al., Fabrication Technologies for Three-Dimensional Integrated Circuits, ISQED '02, IEEE 2002.
International Search Report and the Written Opinion of the International Searching Authority, Sep. 24, 2007.

* cited by examiner

*Primary Examiner*—Tu B Hoang
*Assistant Examiner*—Ayub Maye
(74) *Attorney, Agent, or Firm*—James L. Clingan, Jr.

(57) ABSTRACT

A method of assembling an electronic device includes testing a first wafer of first die to identify the location of functional first die and dividing the first wafer into a set of panels, wherein a panel includes an M×N array of first die. A panel is bonded to a panel site of a second wafer to form a panel stack wherein a panel site defines an M×N array of second die in the second wafer. The panel stack is sawed into a devices comprising a first die bonded to a second die. Dividing the first wafer into panels may be done according statically or dynamically (to maximize the number of panels having a yield exceeding a specified threshold). Binning of the panels and panel sites according to functional die patterns may be performed to preferentially bond panels to panel sites of the same bin.

16 Claims, 5 Drawing Sheets

FABRICATION OF THREE DIMENSIONAL INTEGRATED CIRCUIT EMPLOYING MULTIPLE DIE PANELS

FIELD OF THE INVENTION

The invention is in the field of semiconductor fabrication and, more particularly, semiconductor fabrication using vertical or three dimensional (3D) integration.

RELATED ART

In the field of semiconductor fabrication, 3D integration is a known fabrication and assembly technique in which devices or die from two different substrates or wafers are bonded together prior to packaging. 3D integration beneficially conserves the area required to accommodate two (or more) die resulting in a more compact final product. In addition, 3D integration has the potential for improved performance by reducing delays associated with conventional interconnects.

One challenge presented by 3D technology is the placement of the first die on top of the second die. Depending upon the positioning or alignment precision desired, the die to die placement procedure can add significantly to the cost of the finished product. To address this unwanted cost, a "wafer-to-wafer" 3D interconnect technique bonds a first wafer directly to a second wafer before sawing either wafer into individual devices. In this embodiment, the positioning cost referred to above is incurred only once for an entire wafer. On the other hand, wafer-to-wafer bonding has at least two problems. First, wafer-to-wafer bonding implies that the two die being bonded together are of the same stepping dimension on the wafer so that when one die from the first wafer is aligned to a corresponding die on the second wafer, all of the die on the first wafer will be aligned to all of the die on the second wafer. A second problem related to the first constraint is that wafer-to-wafer bonding does not include the ability to bond known good die on one wafer selectively to known good die on the other wafer. As a result, wafer-to-wafer bonding almost certainly results in at least some good die on one wafer being bonded to bad die on the other wafer thereby effectively reducing the production yield. Thus, wafer-to-wafer bonding reduces assembly costs at the expense of product yield.

At the other end of the spectrum, "die-to-wafer" assembly, in which the first wafer is sawed into individual die, which are then bonded to die on the second wafer, the assembly cost is high because a die-to-die alignment/positioning operation is required for each die, but the product yield is also high because good die from the first wafer can be selectively bonded to good die on the second wafer. "Die-to-die" assembly is another technique in which both wafers are sawed into individual die prior to bonding. Die-to-die assembly has substantially the same advantages and drawback as die-to-wafer alignment (i.e., high product yield and high assembly cost).

It would be desirable to implement a fabrication and assembly process that attempted to provide an optimization between the high assembly cost associated with die-to-wafer (and die-to-die) assembly and the low product yield associated with wafer-to-wafer assembly.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

In one aspect, a 3D integration method includes sawing a first wafer into "panels" of two or more die. A panel from the first wafer is then aligned and bonded to a region of the second wafer so that each die in the panel aligns to a corresponding die on the wafer. Using multiple-die panels, the described method reduces the number of placements required to implement 3D integration while retaining at least some ability to screen for bad die and selectively place good die from the first wafer with good die in the second wafer. The number of die in the panel is an implementation detail. Larger numbers of die in a panel imply less panel-to-wafer placements, but also lower yield due to loss of ability to align good die to good die. The panel-to-wafer approach thus represents an interim between a die-to-wafer method, in which the number of placements and yield control are both maximized, and a wafer-to-wafer method, in which placements and yield control are both minimized. Depending upon the yield and the size of the panels, the panel-to-wafer method represents the potential for a minimized cost per good device.

Figure 1:
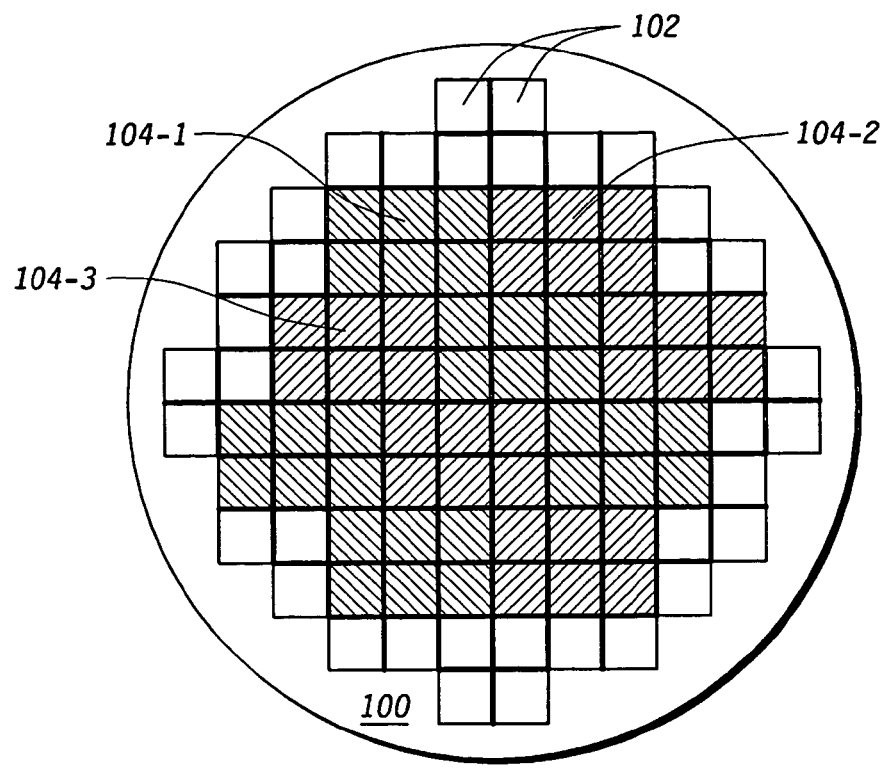
FIG. 1 depicts a first wafer suitable for use in an assembly technique according to the present invention.

Referring now to the drawings, FIG. 1 depicts a first wafer 100. Wafer 100 includes a plurality of die 102. As depicted in FIG. 1, die 102 have been grouped into a set of panels 104-1, 104-2, 104-3, and so forth (generically or collectively referred to as panel(s) 104). In the depicted embodiment, each panel 104 is a 3×2 array of die 102. The number of die in a panel and the configuration of the panel are implementation specific. Preferably, a panel 104 is a rectangular array of M×N die where M and N are integers greater than or equal to 1 and wherein the product of M and N is greater than 1. The number of die in the panel is defined as Z with Z=M×N.

In one embodiment desirable for its simplicity, the grouping of die 102 into panels 104 is static or fixed. In this embodiment, the grouping of die 102 into corresponding panels 104 does not vary from wafer to wafer. In another embodiment, wafer 100 is tested or probed prior to grouping the die into panels. The grouping of die into panels may then be optimized according to predetermined criteria. As an example, die 102 may be grouped in panels 104 dynamically, based on the location of known good die to maximize the number of panels 104 containing X good die where X may be equal to Z (the number of die in the panel) or may be less than Z. Although this embodiment requires additional processing resources, the potential increase in the number of panels with a specified yield percentage may justify the added processing.

Figure 2:
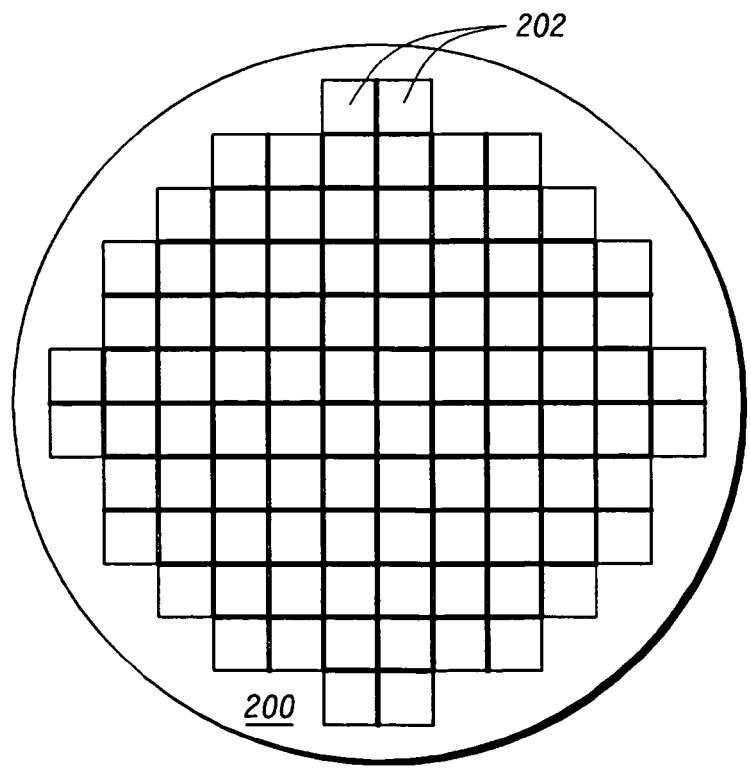
FIG. 2 depicts a second wafer suitable for use in an assembly technique according to the present invention.

FIG. 2 depicts a second wafer 200 that will be used in conjunction with panels 104 from first wafer 100 to achieve a vertically integrated electronic device. Second wafer 200 includes a plurality of second die 200. The electronic device to be fabricated includes a first die 100 from first wafer 100 and a second die 200 from second wafer 200.

First die 102 and second die 202 as depicted in FIG. 1 and FIG. 2 have the same dimensions, but this is not a requirement for panel-to-wafer assembly method. First die 100 and second die 200 may represent different device types (e.g., processors vs. memory) and different technologies (e.g., CMOS vs. bipolar). Similarly, wafers 100 and 200 may be of different starting material (e.g., silicon bulk, silicon SOI (semiconductor on insulator), germanium, gallium arsenide, and the like), and may be of different diameters (e.g., 300 mm vs. 250 mm).

Panel-to-wafer assembly may include "binning" the panels 104 of wafer 100 into different bins or categories depending upon the yield pattern (i.e., the pattern of good die and bad die on the panel). Using the 3×2 panel 104 depicted in FIG. 1 with a minimum yield criteria of ⅚ (i.e., all panels 104 must contain at least five good die) as an example, one binning strategy might include eight bins, namely, a first bin for a panel 104 containing six good die, a reject bin for a panel 104 containing two or more bad die, and six bins for the six different possible configurations in which panel 104 contains one bad die.

By binning panels according to their yield patterns, the panel-to-wafer assembly could achieve further efficiencies by matching a panel 104 to an area of second wafer 200 having the same yield pattern so as to minimize the number of "mismatches" where a mismatch occurs when a good first die 100 is bonded to a bad second die 200 and vice versa. Binning implies additional handling and data processing to maintain the binning after wafer 100 is cut into panels 104 and to align the binned panels 104 optimally on second wafer 200, but, once again, this additional processing may be cost justified in certain applications. Herein, having the same yield pattern is with reference to a panel 104 in the orientation relative to the area of wafer 200 that will be used in the bonding operation. For example, in the case of face-to-face bonding, a panel 104 when inverted for assembly would have the same yield pattern as the area of wafer 200 to which it will be bonded.

Figure 3:
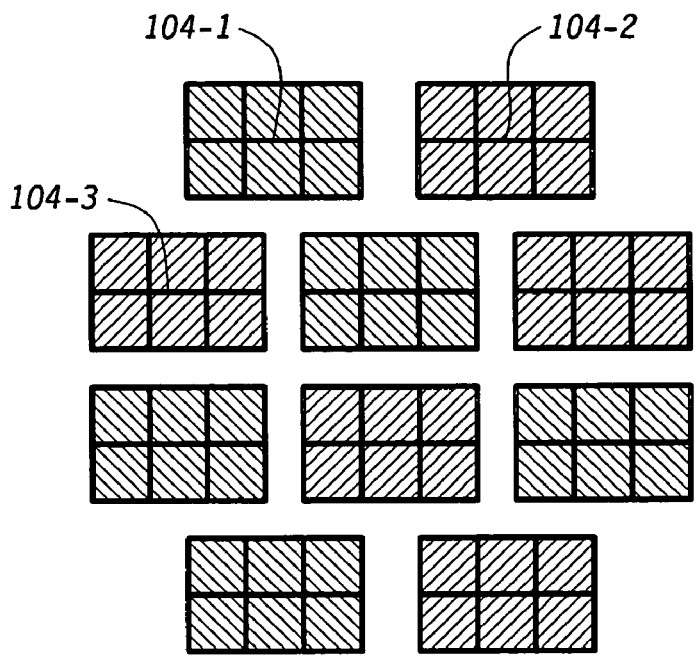
FIG. 3 illustrates sawing the first wafer of FIG. 1 into multiple die "panels" according to an embodiment of the present invention.
Figure 3:
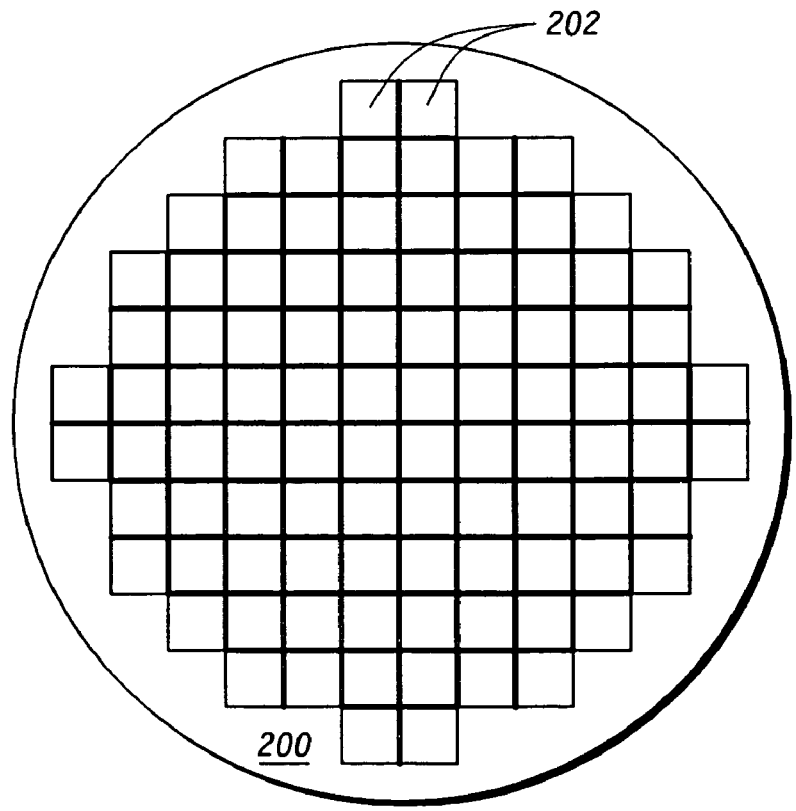

Referring now to FIG. 3, first wafer 100 of FIG. 1 has been sawn into a plurality of panels 104 while second wafer 200 remains intact. In the preferred embodiment, the panel to wafer assembly is achieved using assembly equipment already in existence for use in conventional die to wafer 3D integration methods. As such, the existing assembly equipment may constrain the size of panels 104 in both the X and Y directions to be compatible with existing assembly equipment including existing die to wafer placement equipment. In an embodiment that imposes a threshold yield on the panels 104, panels 104 that fail to meet the yield threshold are discarded. Alternatively, depending upon the size and cost of the die 100 and 200, the panels 104 that fail to meet the yield threshold, but which have at least some good die nevertheless, may be assembled using conventional die to wafer techniques. In such an embodiment, it is hoped that the great majority of assembly is of the panel-to-wafer variety to minimize the impact of placing the die together.

Figure 4:
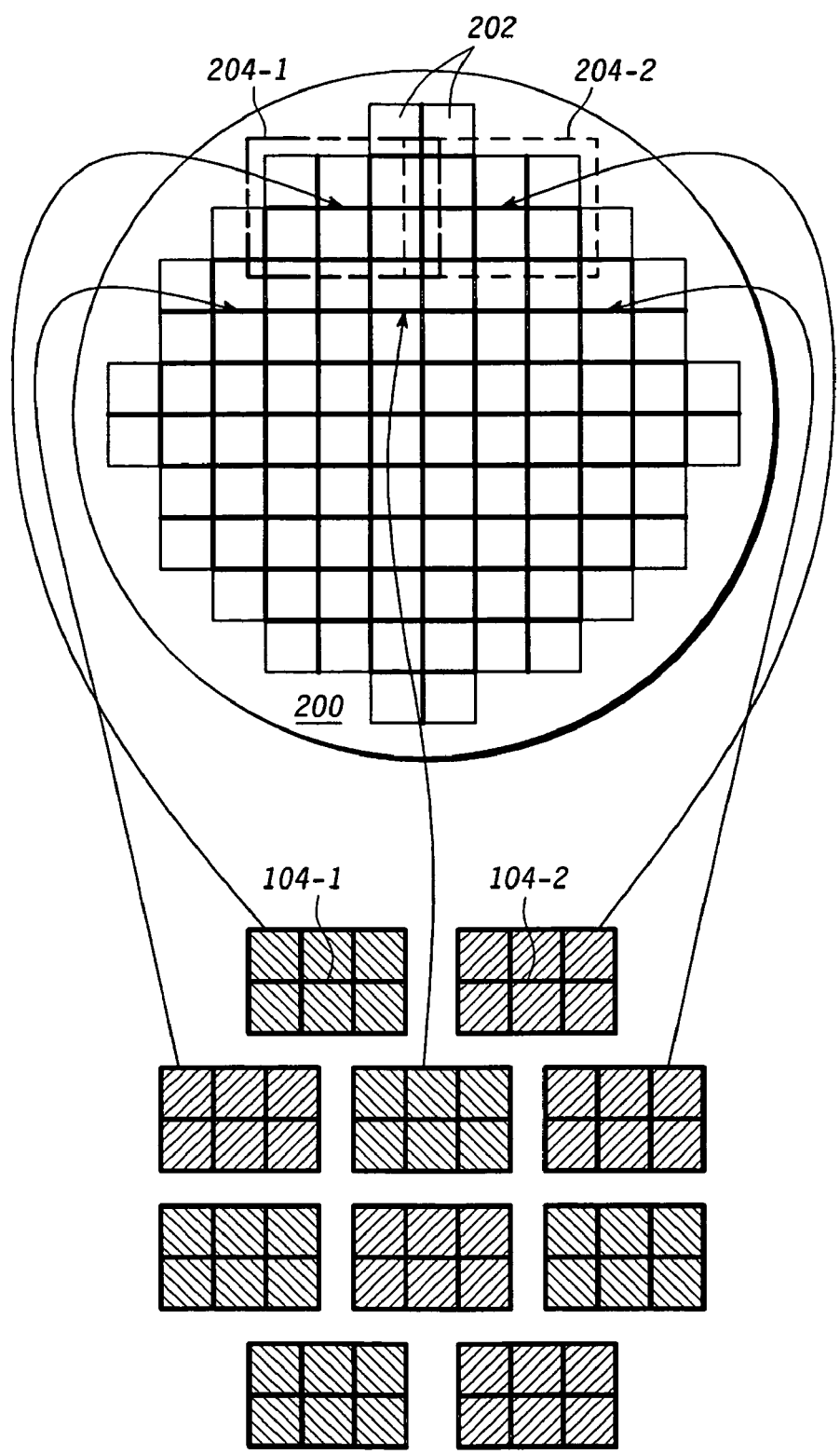
FIG. 4 illustrates bonding of the panels of FIG. 3 to the second wafer of FIG. 2 according to an embodiment of the invention.

FIG. 4 is a conceptual representation of panels 104 being bonded to areas of second wafer 200. In one embodiment, second wafer 200 is not tested to determine its good die and bad die. In such an embodiment, panels 104 may be bonded to second wafer 100 without regard to mismatching with the only goal being to achieve maximum coverage of the die 202 on wafer 200. Because it may not be possible to arrange panels 104 to cover every die 202 on second wafer 200, optimal coverage may seek to "cover" as many die 202 on second wafer 200 as possible. This embodiment may be suitable for an application in which the yield for the second wafer is stable and high (e.g., in excess of 95%).

In another embodiment, second wafer 200 is tested prior to bonding to generate a wafer map (information indicating the location of good die within wafer 200). In one approach, panels 104 are bonded to second wafer 200 in a fixed or static pattern that does not vary from one wafer to the next. In the simplest embodiment, panels 104 are simply bonded to second wafer 200 without regard to the location of good die on second wafer 200. In this approach, the testing of wafer 200 may still provide useful information by indicating which bonded pairs need not be packaged, but the information is not used to reduce the number of bonded mismatches.

In another embodiment, the wafer map of second wafer 200 is used to reduce the number of bonded mismatches. A wafer map may be used to identify good "panel sites" and bad panel sites where a panel site (indicated by referenced numeral 204 in FIG. 4) refers to a group of M×N die on second wafer 200 where M×N are the same dimension as the dimensions of panels 104. Similar to the manner in which panels 104 may be subjected to a yield filter (i.e., a threshold yield below which the entire panel is rejected), panel sites 204 of second wafer 200 may be screened as well. As an example, a panel site 204 of second wafer 200 may be rejected unless the wafer map indicates that at least Y of the panel's die are functional. In this embodiment, each second wafer 200 may be treated as a static array of panel sites 204. For each wafer 200, the number of "good" panel sites and "bad" panel sites is determined from the wafer map based on the desired screening threshold (e.g., all panel sites 204 containing two or more bad die are bad panel sites). During the subsequent bonding processing, panels 104 are bonded only to good panel sites 204 of second wafer 200.

In an embodiment that uses the panel binning as described above, the panel maps 204 of second wafer 200 may be categorized into bins in the same way that panels 104 may be binned. In this embodiment, panels 104 may then be preferably bonded to panel sites 204 of the same bin (i.e., having the same pattern of good die and bad die). Although this embodiment implies additional data base storage and processing and an algorithm that assigns panels 104 to panel sites 204 based on binning, the additional data processing may be justified by higher product yields in the form of lower mismatches.

Regardless of whether second wafer 200 is divided into panel sites 204 statically or otherwise and regardless of whether binning is used, the panel-to-die assembly described has the potential as a cost effective compromise between die-to-wafer assembly, which has a high assembly cost and a high yield, and wafer-to-wafer assembly, which has lower assembly costs but also lower yield.

Figure 5:
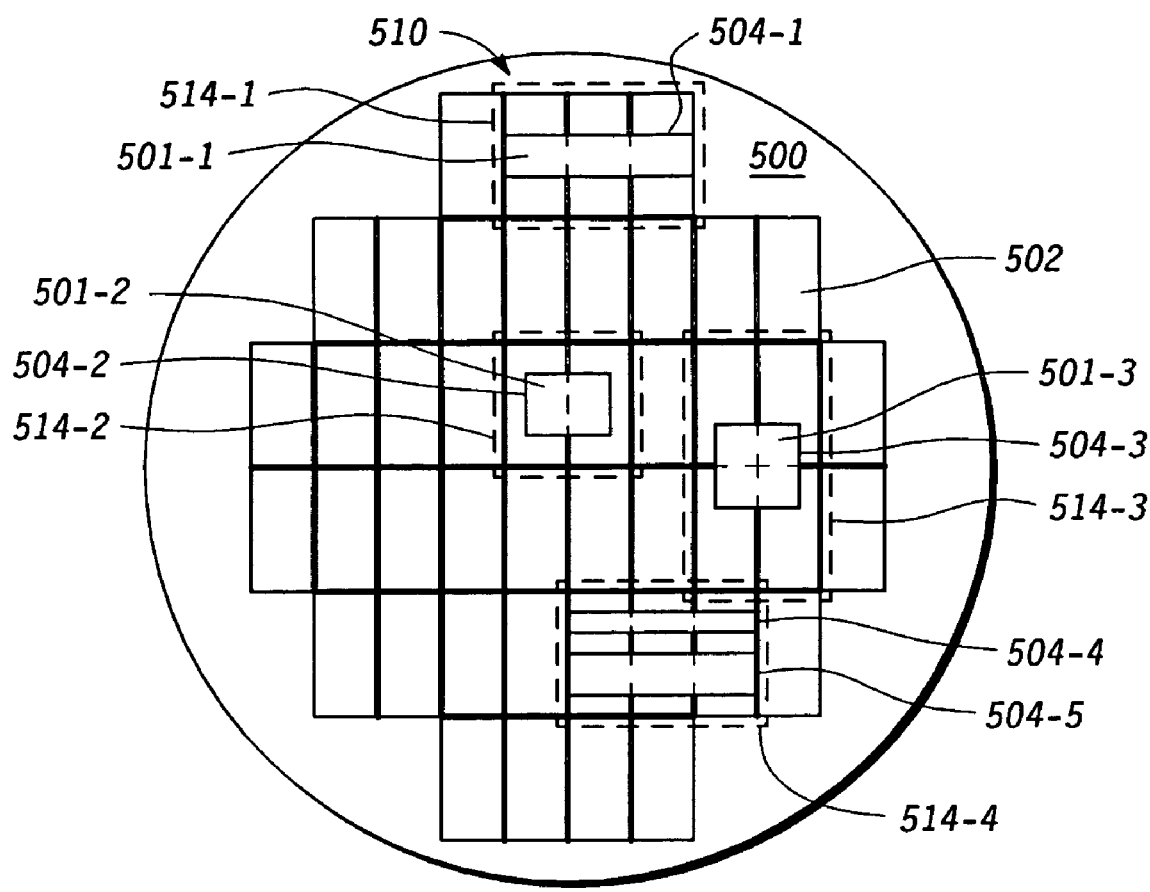
FIG. 5 depicts various implementations of the panel to wafer assembly of the present invention.

Turning now to FIG. 5, various implementations of panel to wafer assembly techniques are illustrated to emphasize the ability to utilize panels of different configuration and assembly where the sizes of the first and second dies do not match. In FIG. 5, a wafer 500 includes a set of die 502 analogous to second wafer 200 and die 202 of FIG. 2.

Shown in FIG. 5 is a first assembly 510, referred to herein as panel stack 510, in which a 3×1 panel 504-1, is bonded to a 3×1 panel site 514-1 of wafer 500. In this assembly, the die 501-1 of panel 504-1 and the die 502 of wafer 500 share one dimension, but are different in their respective second dimensions (i.e., the width of die 501-1 is the same as the width of die 502).

This embodiment may be extended to any M×1 panel and, as will be seen, any M×N where N is less than three.

FIG. 5 also depicts a 2×1 panel 504-2 bonded to a 2×1 panel site 514-2 where the die 501-2 of panel 504-2 does not share a common dimension with the die 502 of wafer 500. In this embodiment, panel to wafer assembly is achieved by placing panel 504-2 to straddle adjacent die of panel site 514-2. While this embodiment may have implications regarding the manner in which die 502 are oriented with respect to one another (and possibly about the manner in which wafer 500 is probed or otherwise tested), it beneficially encompasses the ability to use the panel to wafer assembly approach for differently sized die. An extension of this assembly is indicated by panel 504-3 and panel site 514-3 in which a 2×2 panel 504-3 is bonded to panel 514-3 where the die 501-3 of panel 504-3 are differently sized than die 502 (i.e., die 502 and die 501-3 do not share a common dimension). These embodiments illustrate the ability to use differently sized die for any M×N panel where M and N are less than 3. For any panel in which M or N is greater than 2, the die in the panel must share a common dimension with the die in the corresponding panel site (because straddling is not an option for panels of dimension greater than 2).

Thus FIG. 5 emphasizes the ability to extend panel to wafer assembly to die having different dimensions. In addition, FIG. 5 illustrates an embodiment in which a first 3×1 panel 504-4 and a second 3×1 panel 504-5 are both bonded to a single panel site 514-4 of wafer 500. In this embodiment, first panel 504-4 is bonded to a different region of panel sited 514-4 than panel 504-5. This embodiment extends the ability to bond a pair of die together to three or more die. As an example, a system on chip (SOC) device might be assembled by bonding a memory 504-4 and a digital signal processor panel 504-5 to a general purpose processor panel site 514-4.

Figure 6:
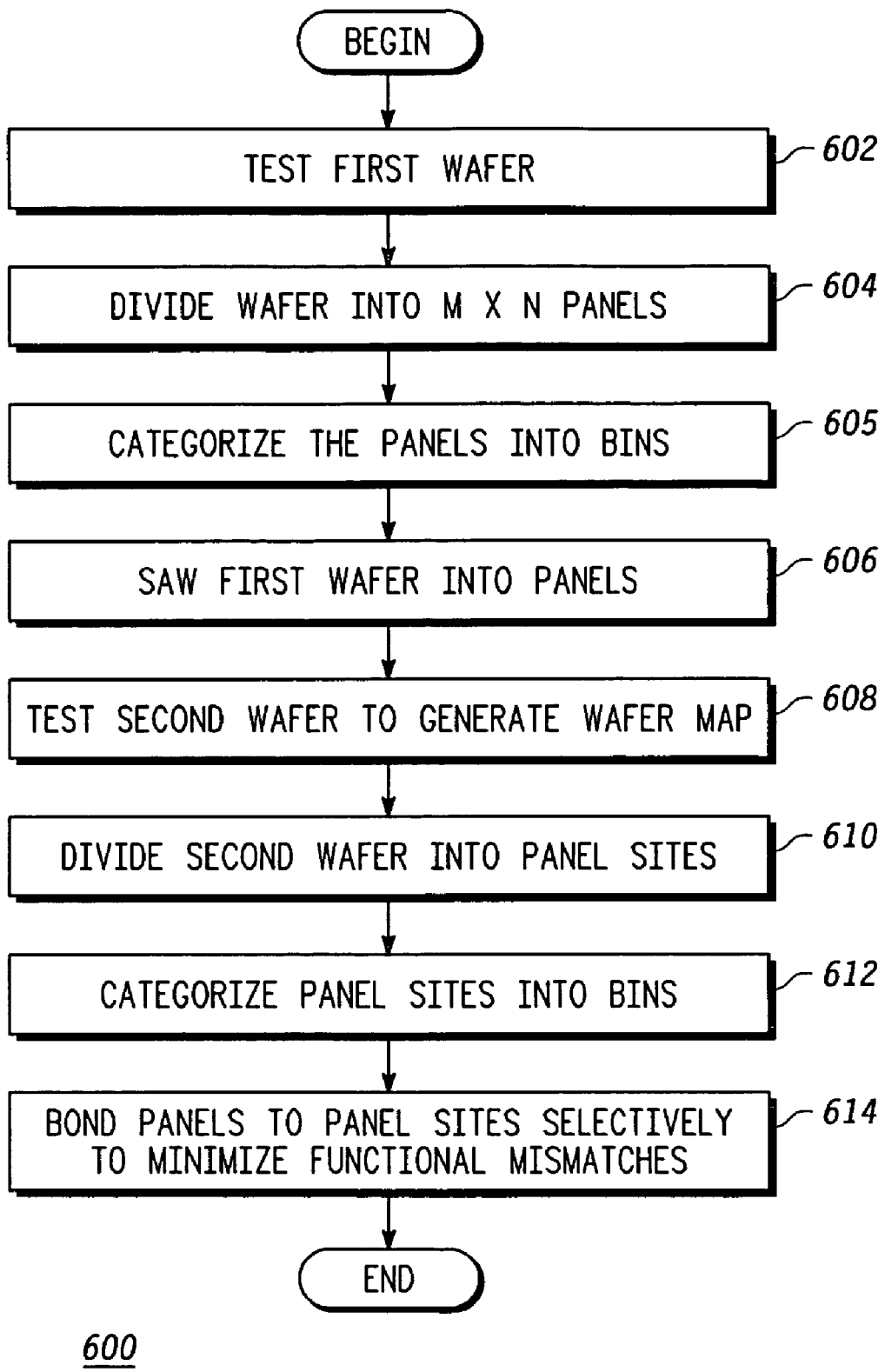
FIG. 6 is a flow diagram of an assembly technique according to one embodiment of the invention.

The assembly processes described above are represented graphically by the flow diagram of an assembly method 600 of FIG. 6. The embodiment of assembly method 600 depicted in FIG. 6 includes some optional steps intended to result in the highest product yield (i.e., lowest number of functional mismatches. Other embodiments of method 600 may omit one or more of these optional steps, especially where the yield on the first wafer or the second wafer is reasonably predictable and sufficiently high, in which case it may be advantageous to only test the die on the wafer which has a less predictable or lower yield. If, however, the yields of the first and second wafer are both expected to exceed a specified threshold, testing of either wafer may be an unproductive cost (i.e., testing does not eliminate enough assembly processing to justify the cost of the testing itself). If neither wafer is tested, then "blind" wafer-to-wafer bonding is the most cost effective option (i.e., has the fewest alignment costs).

In the embodiment depicted in FIG. 6, assembly method 600 includes testing (block 602) the first wafer 100 to determine the location of functional and nonfunctional first die 102. As indicated above, the higher assembly cost of panel to wafer assembly relative to wafer to wafer assembly is justified only if panel to wafer assembly produces an increase in product yield in the form of reduced functional mismatches. As such, panel to wafer assembly implies testing of at least one of the wafers and possibly both.

Assembly method 600 as depicted in FIG. 6 further includes dividing (block 604) the tested wafer 100 into panels 104 of M×N die 102, where M and N are integer variables that may vary from application to application. Dividing wafer 100 into panels 104 may be done statically (i.e., the location of panels 104 on wafer 100 does not vary from wafer to wafer) or dynamically such as in a technique where "panelization" is done to maximize the number of panels exceeding a specified yield threshold.

After panelization in block 604, the depicted embodiment of method 600 includes an optional process in which the panels 104 identified in block 604 are categorized in block 605 into bins that are indicative of the pattern of functional and nonfunctional die 102 in each panel 104. Block 605 may be employed in an embodiment to achieve optimal matching between functional die on first wafer 100 and functional die on a second wafer 200.

After testing, panelization, and any binning or categorization of first wafer 100, wafer 100 is then sawed (block 606) into panels 104. Depending upon the implementation, method 600 may provide the ability to distinguish the panels 104 from one another such as in an implementation in which the different bins of panels 104 are identifiable.

The depicted embodiment of method 600 further includes testing (block 608) the second wafer 200 to generate a wafer map indicating the location of good and bad die 202 on second wafer 200. As indicated previously, other embodiments of method 600 may omit the testing of second wafer 200, especially if the yield and yield pattern of the second wafer 200 is predictable.

Following testing of second wafer 200, the second wafer may then be divided (block 610) into panel sites 204 analogous to the manner in which first wafer 100 was divided into panels 104 in block 604. Like block 604, the dividing process of block 610 may be static or dynamically based on the patterns of good die and bad die. The dividing process of block 610 is intended to identify panel sites that are suitable for bonding with panels 104 from wafer 100. This process may include identifying good panel sites 204 (panel sites to which a good panel 104 will be bonded) and identifying bad panel sites (panel sites to which no panel 104 will be bonded). Thereafter, second wafer 200 may be categorized (block 612) into bins that preferably correspond to any bins into which first wafer 100 is categorized.

Finally, in block 614, screened panels 104 are selectively bonded (bock 614) to identified panel sites 204 of wafer 200. In the preferred embodiment, the bonding of panels 104 to panel sites 204 results in a lower number of functional mismatches than would occur in blind wafer to wafer assembly. Moreover, it is presumed that the reducing in functional mismatches achievable using panel to wafer assembly justifies any increase in cost associated with testing the wafers, processing the resulting data, and handling the panels.

In summary, the described assembly technique provides an solution between the polar extremes of wafer to wafer bonding, in which product yield is unnecessarily sacrificed and undesirable restraints are placed upon the die sizes of the individual components and traditional die to wafer assembly in which assembly costs are undesirably high. The invention has been described with reference to specific embodiments. However, one of ordinary skill in the art appreciates that various modifications and changes can be made without departing from the scope of the present invention as set forth in the claims below. For example, the wafer diameters of the first and second wafers may vary depending upon the implementation and the product types and the technology types of the two (or more) die may be different. Furthermore, while the invention has been described as assembling panels from a first wafer on to a second wafer, it is understood that some of panels might come from other wafers of the same type as the first wafer. Accordingly, the specification and figures are to be regarded in an illustrative rather than a restrictive sense, and all such modifications are intended to be included within the scope of present invention.

Benefits, other advantages, and solutions to problems have been described above with regard to specific embodiments.

However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A method of assembling of an electronic device, comprising:
    testing a first wafer comprising a plurality of first sets of dies to identify the location of functional first sets of dies within the first wafer;
    dividing the first wafer into a plurality of first sets of multiple-die panels, wherein each panel includes an M×N array of the first die wherein each panel of the first set of multiple-die panels includes a plurality of first sets of dies;
    categorizing the plurality of first sets of multiple-die panels into a first plurality of bins based on a predetermined yield pattern associated with the first wafer;
    bonding the first set of multiple-die panels to panel sites of a second wafer to form a panel stack, wherein the panel sites include an M×N array of second sets of dies, wherein bonding includes testing and categorizing the panel sites of the second wafer into a second plurality of bins based on the predetermined yield pattern associated with the first wafer and wherein the bonding step further includes bonding the first set of multiple-die panels to the panel sites of the second wafer selectively to minimize functional mismatches; and
    sawing the panel stack into a set of electronic devices, each electronic device comprising a first die bonded to a second die.

2. The method of claim 1, wherein dividing the first wafer comprises dividing the first wafer according to a static mapping of panels in the first wafer.

3. The method of claim 1, wherein dividing the first wafer comprises dividing the first wafer to maximize the number of panels having a panel yield exceeding a specified threshold wherein a panel yield indicates the number of functional first die in a panel.

4. The method of claim 1 wherein each bin is associated with a corresponding pattern of functional die within the panel.

5. The method of claim 1, wherein the first die and the second die share a common dimension and wherein the M×N array includes at least three die in at least one of the array dimensions.

6. The method of claim 1, wherein the M×N array is selected from a group of arrays consisting of a 2×1 array and a 2×2 array and wherein the first die and the second die are of different dimensions.

7. The method of claim 1, wherein the first wafer and the second wafer are of different dimensions.

8. The method of claim 1, wherein the second die is a processor die and the first die is a memory die.

9. A method of assembling of an electronic device, comprising:
    dividing a first wafer having a plurality of die into a set of multiple-die panels, wherein a panel includes an M×N array of a first sets of dies, wherein each panel of the set of multiple-die panels includes a plurality of the die from the first wafer;
    testing a second wafer comprising a plurality of second sets of dies to identify the location of functional second sets of dies within the second wafer;
    determining panel sites of the second wafer, wherein the panel sites include an M×N array of second sets of dies, wherein determining the panel sites of the second wafer comprises selecting panel sites to maximize the number of panel sites having a panel site yield exceeding a specified threshold wherein a panel site yield indicates the number of functional second sets of dies in a panel site;
    binning the panel sites of the second wafer into one of multiple bins, wherein each bin is associated with a corresponding pattern of functional second die within the panel site;
    bonding a panel to a panel site of a second wafer to form a panel stack; and
    sawing the panel stack into a set of electronic devices, each electronic device comprising a first die bonded to a second die.

10. The method of claim 9, wherein the first die and the second die share a common dimension and wherein the M×N array includes at least three die in at least one of the array dimensions.

11. The method of claim 9, wherein the M×N array is selected from a group of arrays consisting of a 2×1 array and a 2×2 array and wherein the first die and the second die are of different dimensions.

12. The method of claim 9, wherein the first wafer and the second wafer are of different dimensions.

13. The method of claim 9, wherein the second die is a processor die and the first die is a memory die.

14. A method of assembling an electronic device, comprising:
    sawing a first wafer having a plurality of first sets of dies into a panel comprising an M×N array of first die, wherein either M or N is greater than 1, wherein each panel includes a plurality of first sets of dies;
    forming a panel site by bonding the panel to a panel site of a second wafer having a plurality of second sets of dies, wherein the panel site encompasses an M×N array of the second sets of dies;
    testing the first wafer to identify functional first sets of dies and testing the second wafer to identify functional second sets of dies;
    selecting a panel and a corresponding panel site for bonding based upon a matching pattern of functional die in the panel and the panel site; and
    sawing the panel site into a device comprising a first sets of dies from the panel bonded to a second sets of dies from the panel site.

15. The method of claim 14, further comprising testing the first wafer to identify functional first die and discarding a panel if a percentage of functional first die is less than a specified threshold.

16. The method of claim 14, further comprising testing the second wafer to identify functional second die and eliminating a panel site if a percentage of functional second is less than a specified threshold.

* * * * *